United States Patent
Wei et al.

(10) Patent No.: US 12,493,237 B2
(45) Date of Patent: Dec. 9, 2025

(54) EUV PELLICLE AND MOUNTING METHOD THEREOF ON PHOTO MASK

(71) Applicant: TAIWAN SEMICONDUCTOR MANUFACTURING COMPANY, LTD., Hsinchu (TW)

(72) Inventors: Wen-Yao Wei, Hsinchu (TW); Chi-Lun Lu, Hsinchu (TW); Hsin-Chang Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 155 days.

(21) Appl. No.: 18/232,270

(22) Filed: Aug. 9, 2023

(65) Prior Publication Data
US 2024/0061325 A1 Feb. 22, 2024

Related U.S. Application Data

(62) Division of application No. 17/162,997, filed on Jan. 29, 2021, now Pat. No. 11,822,230.

(60) Provisional application No. 63/056,530, filed on Jul. 24, 2020.

(51) Int. Cl.
*G03F 1/64* (2012.01)
(52) U.S. Cl.
CPC ..................................... *G03F 1/64* (2013.01)
(58) Field of Classification Search
CPC ..................................... G03F 1/62; G03F 1/64
See application file for complete search history.

(56) References Cited

U.S. PATENT DOCUMENTS

| 6,841,312 B1* | 1/2005 | Kalk | G03F 1/64 355/75 |
| 2002/0090558 A1* | 7/2002 | Shirasaki | G03F 7/70808 430/5 |
| 2016/0154299 A1* | 6/2016 | Choi | G03F 1/64 430/5 |

(Continued)

FOREIGN PATENT DOCUMENTS

| CN | 105051604 A | 11/2015 |
| JP | 2013195950 A | 9/2013 |

(Continued)

OTHER PUBLICATIONS

Notice of Allowance issued in U.S. Appl. No. 17/162,997, dated Jul. 17, 2023.

(Continued)

*Primary Examiner* — Stewart A Fraser
(74) *Attorney, Agent, or Firm* — STUDEBAKER BRACKETT PLLC

(57) ABSTRACT

In a method of de-mounting a pellicle from a photo mask, the photo mask with the pellicle is placed on a pellicle holder. The pellicle is attached to the photo mask by a plurality of micro structures. The plurality of micro structures are detached from the photo mask by applying a force or energy to the plurality of micro structures before or without applying a pulling force to separate the pellicle from the photo mask. The pellicle is de-mounted from the photo mask. In one or more of the foregoing and following embodiments, the plurality of micro structures are made of an elastomer.

20 Claims, 18 Drawing Sheets

(56) References Cited

U.S. PATENT DOCUMENTS

2018/0307133 A1  10/2018  Alvarez et al.
2018/0314150 A1  11/2018  Brouns et al.
2018/0329314 A1  11/2018  Kruizinga et al.

FOREIGN PATENT DOCUMENTS

| KR | 10-2010-0076690 A | 7/2010 |
| KR | 2016-0064923 A | 6/2016 |
| KR | 2018-0031422 A | 3/2018 |
| KR | 102122776 B1 | 6/2020 |
| TW | 201626101 A | 7/2016 |
| TW | 201901287 A | 1/2019 |
| TW | 201923447 A | 6/2019 |

OTHER PUBLICATIONS

Non-Final Office Action issued in U.S. Appl. No. 17/162,997, dated Mar. 8, 2023.
Notice of Allowance issued in U.S. Appl. No. 17/162,997, dated Dec. 2, 2022.

* cited by examiner

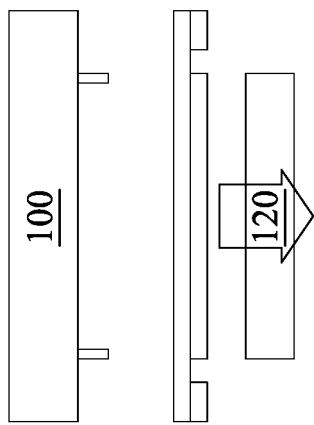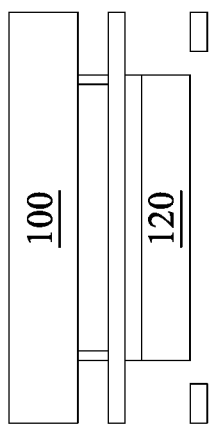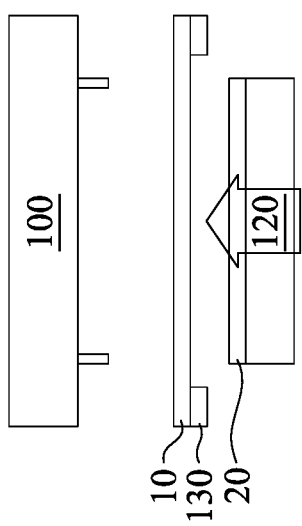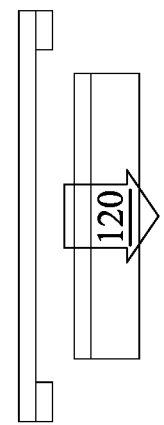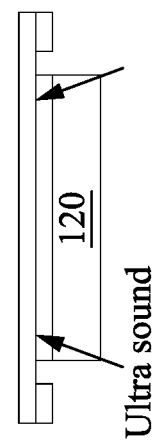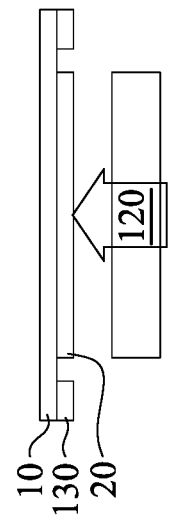

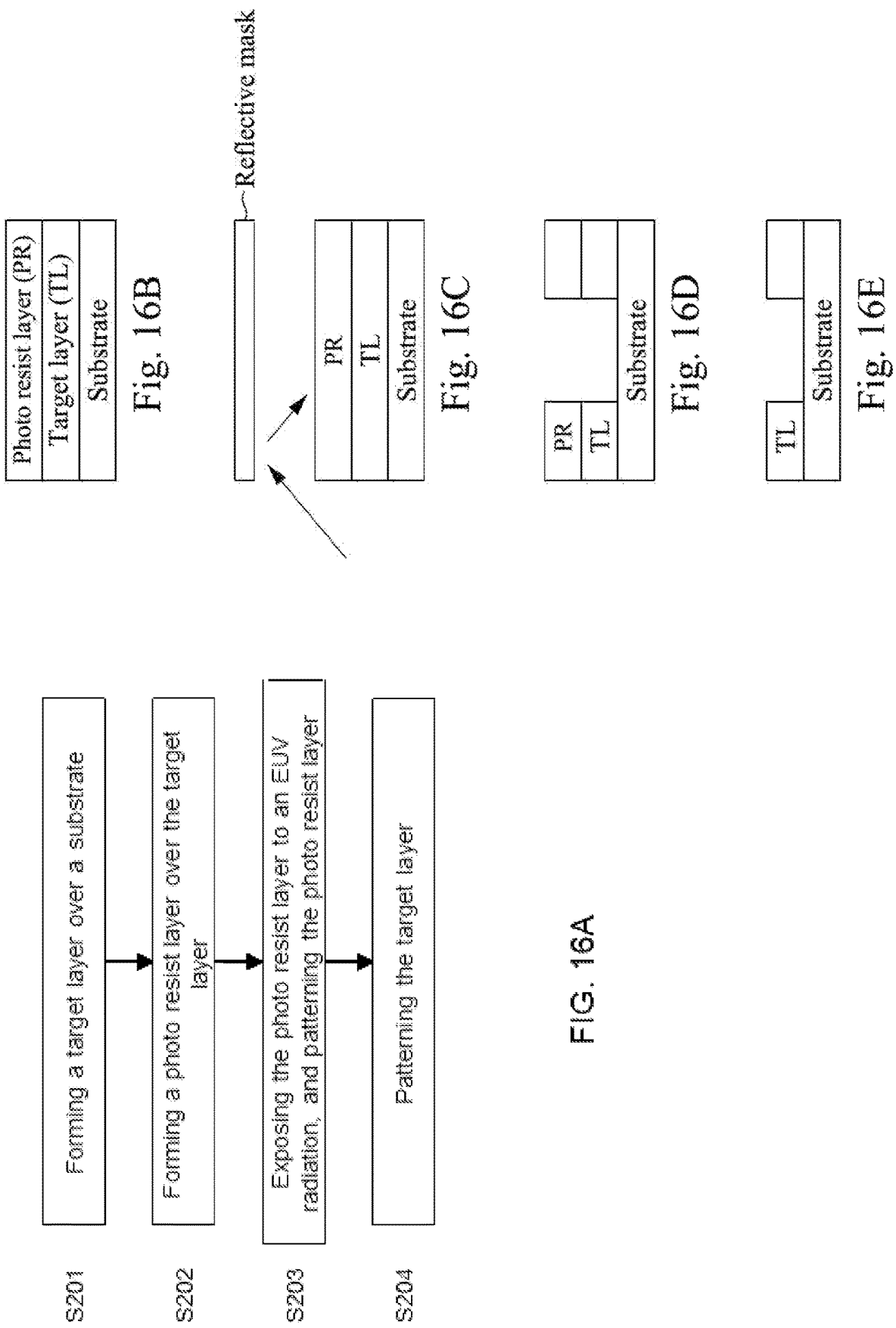

EUV PELLICLE AND MOUNTING METHOD THEREOF ON PHOTO MASK

RELATED APPLICATION

This application is a divisional of U.S. patent application Ser. No. 17/162,997 filed Jan. 29, 2021, which claims priority to U.S. Provisional Application No. 63/056,530 filed on Jul. 24, 2020, the entire disclosure of each of which is incorporated herein by reference.

BACKGROUND

During an integrated circuit (IC) design, a number of layout patterns of the IC, for different steps of IC processing, are generated. The layout patterns include geometric shapes corresponding to structures to be fabricated on a substrate. The layout patterns may be patterns on a mask that are projected, e.g., imaged, by a radiation source on a photoresist layer on the substrate to create the IC. A lithography process transfers the pattern of the mask to the photoresist layer of the substrate such that etching, implantation, or other steps are applied only to predefined regions of the substrate. Transferring the pattern of the mask to the photoresist layer may be performed using an extreme ultraviolet (EUV) radiation source to expose the photoresist layer of the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 14A, 14B, 14C, 14D, 14E and 14F show pellicle mounting and dismounting operations in accordance with some embodiments of the present disclosure.

FIG. 16A shows a flowchart of a method making a semiconductor device, and FIGS. 16B, 16C, 16D and 16E show a sequential manufacturing operation of a method of making a semiconductor device in accordance with embodiments of present disclosure.

DETAILED DESCRIPTION

Figure 1:
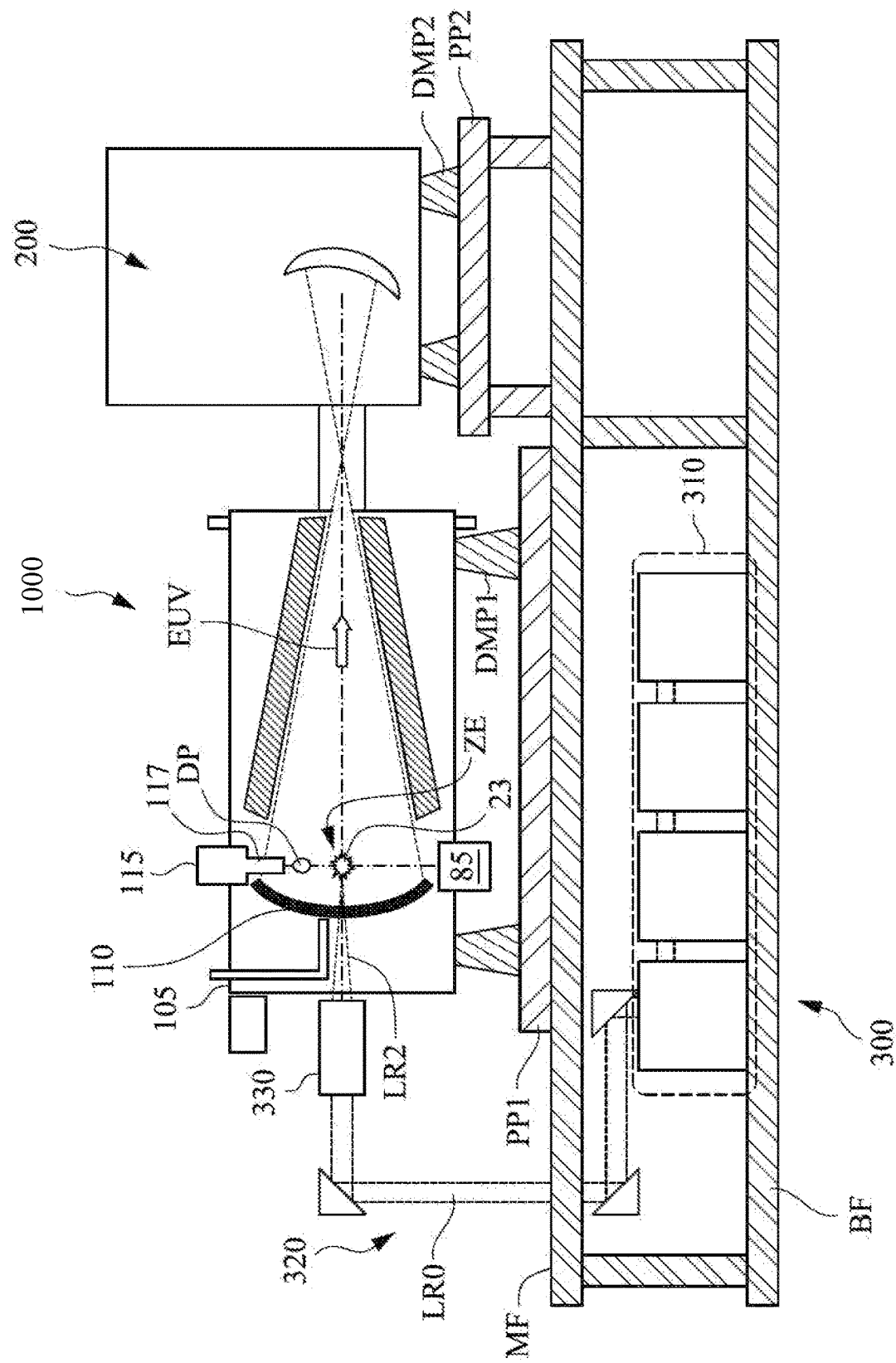
FIG. 1 shows a schematic view of an extreme ultraviolet (EUV) lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, structures, conditions and operations explained with respect to one embodiments can be employed in the other embodiments, and some of the explanations may be omitted.

A pellicle is a thin transparent film stretched over a frame that is attached with an adhesive over one side of a photo mask (also known as a reticle) to protect the photo mask from damage, dust, and/or moisture. Further, when an EUV photo mask is covered by a pellicle, particles will settle on the pellicle instead of the EUV photo mask and, thus, when the patterns on the EUV photo mask are imaged on a substrate, the particles that are not in the plane of the EUV photo mask do not create a focused image on the substrate. It is desirable that the pellicle is highly transparent to the radiation source of the lithography process. In EUV lithography, the pellicle is should be highly transparent in the EUV wavelength region and have high durability.

In some embodiments, when the pellicle is placed, e.g., mounted, on top of the EUV photo mask, the pellicle is placed on top of a plurality of adhesive studs or fixtures and a distance between about 2 mm to about 5 mm is created between the EUV photo mask and the pellicle. Thus, in some embodiments, one or more openings is created by the distance between the EUV photo mask and the pellicle. In some embodiments, the pellicle is attached to a mounting fixture and the mounting fixture is attached over the EUV photo mask with a number of adhesive studs, e.g., four studs at the four corners of the EUV photo mask. Alternatively, the distance between the EUV photo mask and the pellicle may be fully sealed and no opening is created by the distance between the EUV photo mask and the pellicle.

FIG. 1 shows a schematic view of an EUV lithography system with a laser produced plasma (LPP) EUV radiation source in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2. In some embodiments, an EUV photo mask is transferred into the exposure device 200. As noted, the exposure device 200 is maintained under a vacuum environment and the EUV photo mask is mounted over a substrate, with a photo resist layer disposed on the substrate. The EUV photo mask has a pellicle mounted over the EUV photo mask. After transferring the EUV photo mask with the pellicle into the exposure device 200, the air pressure in the enclosure between the EUV photo mask and the pellicle is equalized with the vacuum environment of the exposure device 200 through the holes in the mounting fixture (the frame). The EUV radiation generated by the EUV radiation source 100 is directed by the optical components to project the mask on the photo resist layer of the substrate. In some embodiments, after the exposure of the mask on the photo resist layer of the substrate, the EUV photo mask with the pellicle is transferred out of the exposure device 200. After transferring the EUV photo mask with the pellicle out of the exposure device 200, the air pressure in the enclosure between the EUV photo mask and the pellicle is equalized with the atmospheric pressure outside the exposure device 200 through the holes in the mounting fixture.

In the present disclosure, the terms mask, photo mask and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask. The mask is described with respect to FIGS. 3A and 3B.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the laser beam LR1 is also focused by the focusing apparatus 330.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm.

In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. A droplet DP that does not interact with the laser pulses is captured by the droplet catcher 85.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp} = d/(t_{rad} - t_o) \qquad \text{equation (1)}.$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2:
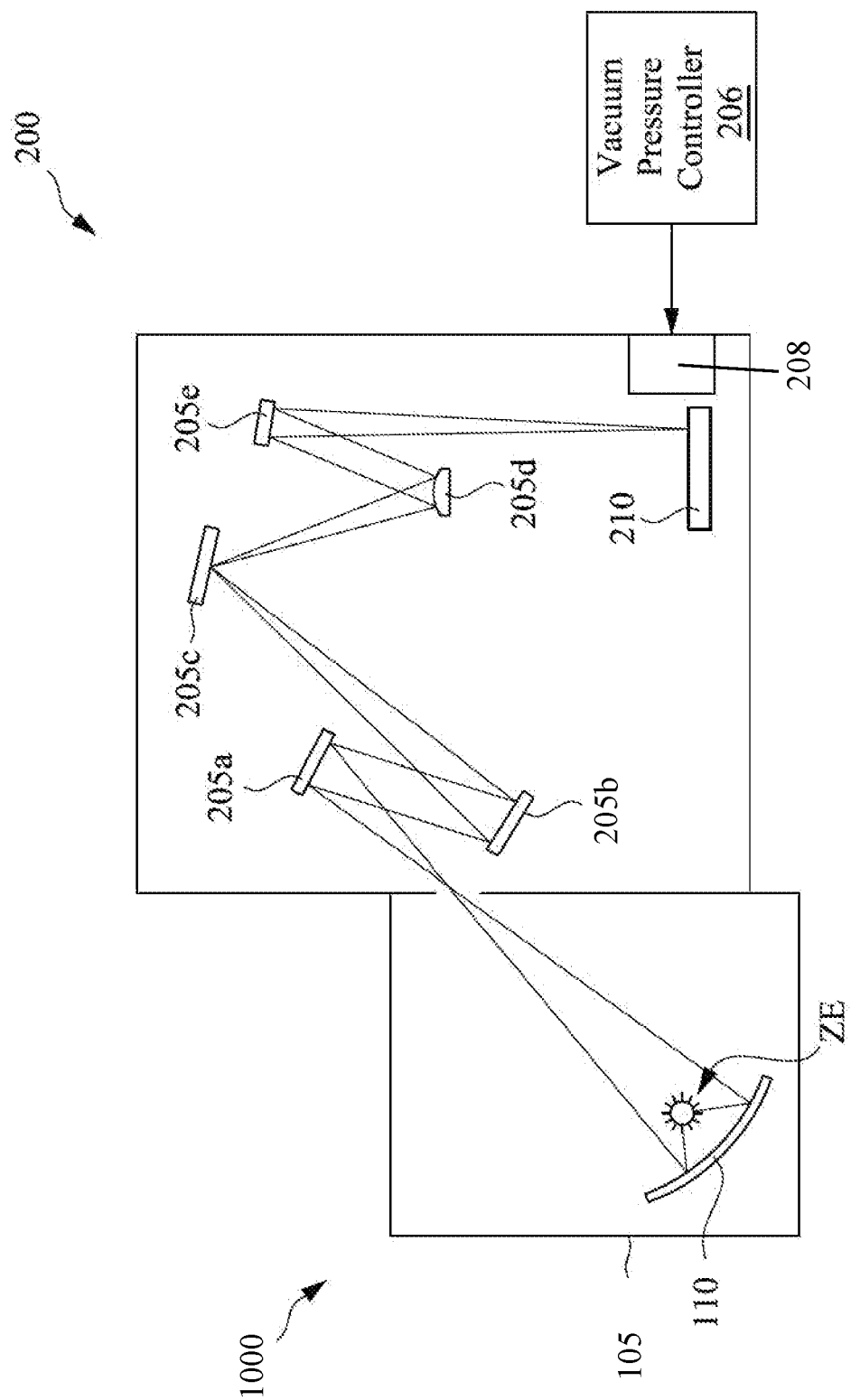
FIG. 2 shows a schematic view of an EUV lithography exposure tool in accordance with some embodiments of the present disclosure.

FIG. 2 shows a schematic view of an EUV lithography (EUVL) exposure tool in accordance with some embodiments of the present disclosure. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a EUV photo mask, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., a reflective mask 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210. In some embodiments, a pressure inside the exposure device 200 is sensed by a pressure sensor 208 inside the exposure device 200 and is controlled by a vacuum pressure controller 206 that is coupled to the exposure device 200.

As noted above, because gas molecules absorb EUV light, the lithography system for the EUV lithography patterning, e.g. the exposure device 200, is maintained in a vacuum environment to avoid EUV intensity loss. After transferring the EUV photo mask with the pellicle into the exposure device 200, the air pressure in the enclosure between the EUV photo mask and the pellicle is equalized with the vacuum environment of the exposure device 200 through the holes in the mounting fixture (the frame) and, thus, vacuum is produced in the enclosure between the EUV photo mask and the pellicle. In some embodiments, after the exposure of the mask on the photo resist layer of the substrate, the EUV photo mask with the pellicle, the EUV photo mask structure, is transferred out of the exposure device 200. After transferring the EUV photo mask with the pellicle out of the exposure device 200, the vacuum in the enclosure between the EUV photo mask and the pellicle is equalized with the atmospheric pressure outside the exposure device 200 through the holes in the mounting fixture and, thus, atmospheric pressure in produced in the enclosure between the EUV photo mask and the pellicle.

Figure 3A:
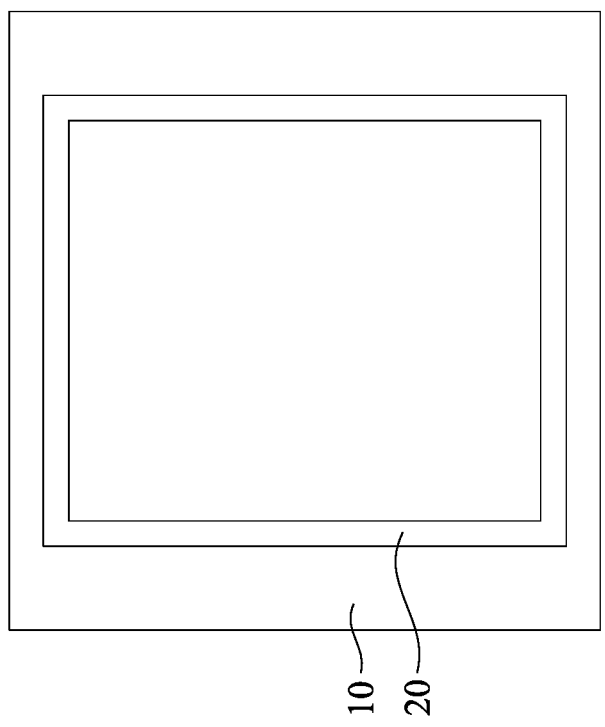
FIG. 3A is a plan view and FIG. 3B is a cross-sectional view of a reflective photo mask with a pellicle in accordance with some embodiments of the present disclosure.
Figure 3B:
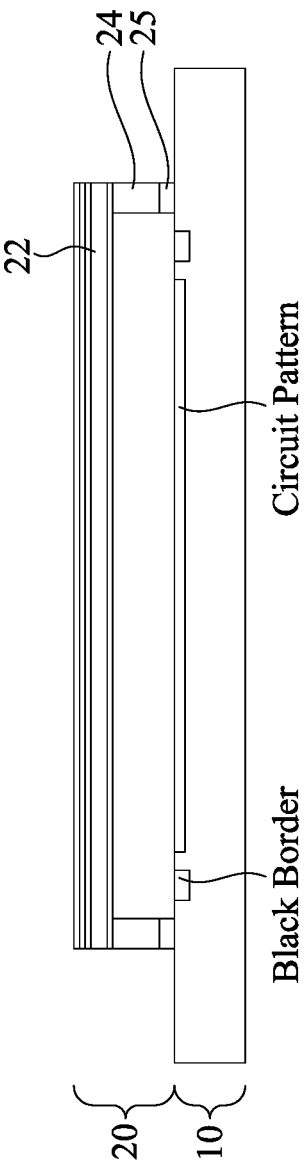

FIG. 3A is a plan view and FIG. 3B is a cross-sectional view of a reflective EUV photo mask with a pellicle in accordance with some embodiments of the present disclosure.

The reflective EUV photo mask 10 is covered by a pellicle 20 as shown in FIGS. 3A and 3B. The EUV photo mask 10 includes a substrate, reflective multiple layers (ML) that are deposited on the substrate, a conductive backside coating, a capping layer disposed on the reflective ML, and an absorption layer on the capping layer. In some embodiments, the material of the substrate 30 includes $TiO_2$ doped $SiO_2$, or other suitable materials with low thermal expansion. In some embodiments, the substrate includes fused quartz and has a thickness between about 6 mm to about 7 mm. In some embodiments, the ML includes a plurality of film pairs, such as molybdenum-silicon (Mo/Si) film pairs (e.g., a layer of molybdenum layer above or below a layer of silicon layer in each film pair). In some embodiments, the ML has 40 to 50 pairs of the molybdenum layer and the silicon layer and each molybdenum layer has a thickness of 3 nm and each silicon layer has a thickness of 4 nm. Thus, in some embodiments, the ML has a thickness between 280 nm to 350 nm. Alternatively, the ML may include molybdenum-beryllium (Mo/Be) film pairs, or other suitable materials that are configured to highly reflect the EUV light. The capping layer may include ruthenium (Ru) and may be disposed on the ML for protection and may have a thickness of 2.5 nm. In some embodiments, the capping layer may include Ru or silicon (Si) and may be disposed on the ML for protection and may have a thickness of 4 nm. In some embodiments, the absorption layer that includes a tantalum boron nitride (TaBN) layer is deposited over the ML and the capping layer. In some embodiments, the absorption layer is patterned with pattern features to define a layout pattern for layer of an integrated circuit (IC). In some embodiments, the backside coating includes chromium nitride (CrN) or tantalum boride (TaB) and has a thickness of 20 nm to 100 nm. In some embodiments, another reflective layer may be deposited over the ML and is patterned to define a layer of an integrated circuit, thereby forming an EUV phase shift EUV photo mask. In some embodiments, the absorption layer 45 includes one or a combination of TaBO, TaBN, TaNO, and TaN and has a thickness between 50 nm and 70 nm.

In some embodiments, a pellicle 20 includes a EUV transmissive membrane 22 that includes multiple layers of, for example, a semiconductor material, such as Si, SiC or SiGe; a metal alloy, such as silicide (WSi, NiSi, TiSi, CoSi, MoSi, ZrSi, NiZrSi, etc.); a dielectric material, such as silicon nitride; and a metal material, such as Mo, Zr, Nb, B, Ti or Ru, or other suitable material. In some embodiments, the pellicle 20 includes a frame 24 having an opening. The pellicle 20 is mounted on the EUV photo mask 10 by attaching the frame 24 to the EUV photo mask 10 via the adhesive or glue structure 25.

Mounting the pellicle 20 to the EUV photo mask 10 is generally performed by applying a press force to press the pellicle 10 against the EUV photo mask 10, in particular to a pressure sensitive adhesive material. De-mounting the pellicle 20 from the EUV photo mask 10 is generally performed by applying a pull force to overcome the glue or adhesive force of the adhesive material. In the mounting and de-mounting operations, it is desirable not to leave any residue of the adhesive material on the EUV photo mask. Further, it is desirable to reduce the applying a force and/or a pull force to decrease mounting and/or de-mounting operation time and to avoid rupturing of the pellicle and/or the EUV photo mask. In the following embodiments, structures and processes to mount and de-mount a pellicle to and from an EUV photo mask, which can improve the mounting and/or de-mounting operation of the pellicle are explained.

Figure 4B:
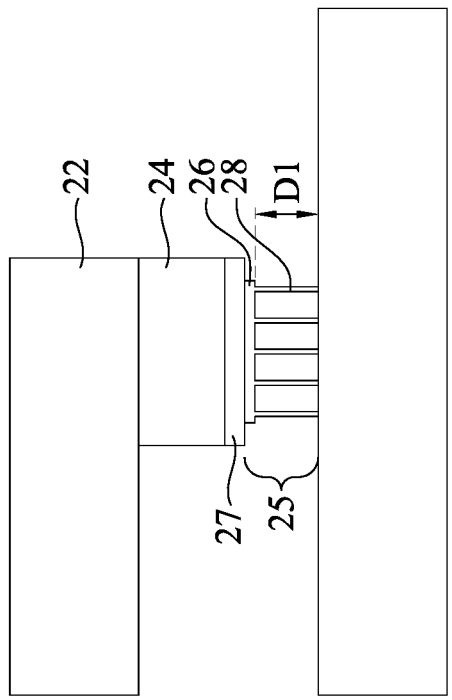
FIGS. 4A and 4B show various views of pellicle mounting structures according to some embodiments of the present disclosure.
Figure 4A:
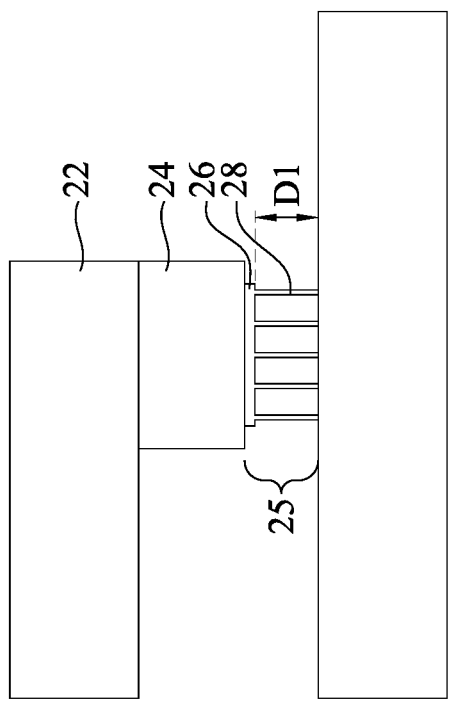

FIGS. 4A and 4B show various views of pellicle mounting structures according to some embodiments of the present disclosure.

In some embodiments, the adhesive structure 25 includes a plurality of micro structures 28. The micro structures 28 are stubs, fibers, protrusions, pillars, columns, wedges, and/or cones. The plurality of micro structures 28 are regularly or randomly arranged spaced apart from each other. In some embodiments, the average diameter of each of the micro structures 28 is in a range from about 0.5 μm to about 500 μm, and is in a range from about 2 μm to about 200 μm in other embodiments. The space between adjacent micro structures 28 is in a range from about 1 μm to about 10,000 μm in some embodiments, and is in a range from about 10 μm to about 1000 μm in other embodiments. In some embodiments, the number of the micro structures 28 per unit area is in a range from 1 pieces/mm$^2$ to about 10,000 pieces/mm$^2$, and is in a range from 10 pieces/mm$^2$ to about 1000 pieces/mm$^2$ in other embodiments. In some embodiments, the smaller the area of the ends of the micro structure to be attached to the photo mask 10 is, the greater the number of the micro structures. In some embodiments, the area A times the number N (AN) is about 0.01 to about 10. When AN is too large, the adhesion force exceeds a required threshold, and it may be difficult to remove the pellicle from the phot mask. When AN is too small, the adhesion force may be insufficient.

In some embodiments, the length of the micro structures 28 as attached to the EUV photo mask 10 is in a range from about 1 μm to about 20,000 μm, and is in a range from about 10 μm to about 1000 μm in other embodiments, and yet in other embodiments, the length is in a range from about 40 μm to about 500 μm. When the length is too small, it may take a longer time to reach a pressure equilibrium state in an EUV scanner. When the length is too large, the effect of pellicle protection may be degraded. In some embodiments, the length D1 of the micro structures 28 before attaching to the EUV photo mask 10 is about 10-40% longer than the length D1. When the micro structures are too thin and/or too little, the adhesive strength is too low and the pellicle may not be stably fixed on the EUV photo mask. When the micro structures are too thick and/or too many, the adhesive strength is too large and the pellicle mounting and/or de-mounting operations may be difficult (requiring higher force). When the micro structures are too short, tolerance in the force in the mounting and/or de-mounting operation is too small, and when the micro structures are too long, the pellicle may not be stably mounted on the EUV photo mask. The micro structures are attached or fixed to the surface of the photo mask 10 via Van der Waals force in some embodiments.

In some embodiments, as shown in FIG. 4A, the plurality of micro structures 28 protrude from a base layer 26 made of the same or different material as the micro structures. In some embodiments, an adhesive layer 27 made of a different material than the base layer 26 and/or the micro structures 28 is disposed between the adhesive structure 25 and the frame 24 as shown in FIG. 4B.

In some embodiments, the plurality of micro structures 28 are made of an elastomer, such as polydimethylsiloxane (PDMS), polyurethane (PU), polymethyl methacrylate (PMMA), polypropylene (PP), polyurethane acrylate (PUA), or fluorocarbon (such as, polytetrafluoroethylene); a shape memory polymer; a magnetic elastomer; carbon nanotubes (CNT), or other suitable material.

FIGS. 5A, 5B, 5C and 5D show pellicle mounting and dismounting operations in accordance with some embodiments of the present disclosure. FIGS. 6A, 6B, 6C, 6D, 6E and 6F also show pellicle mounting and dismounting operations in accordance with some embodiments of the present disclosure.

Figure 5A:
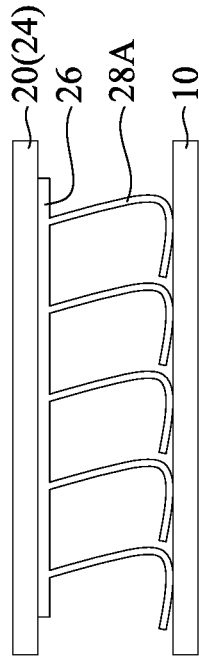
FIGS. 5A, 5B, 5C and 5D show pellicle mounting and dismounting operations in accordance with some embodiments of the present disclosure.
Figure 5C:
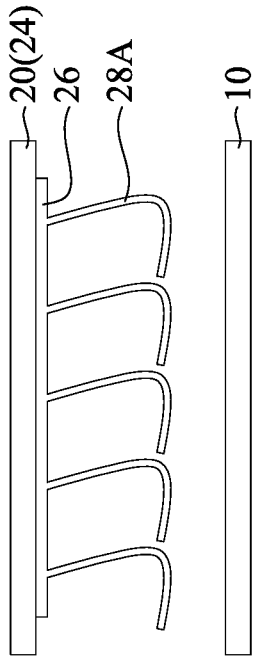
Figure 5B:
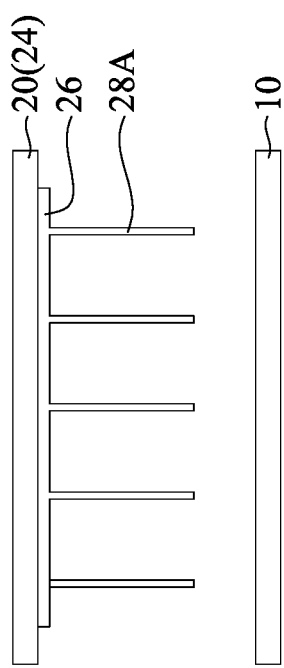
Figure 5D:
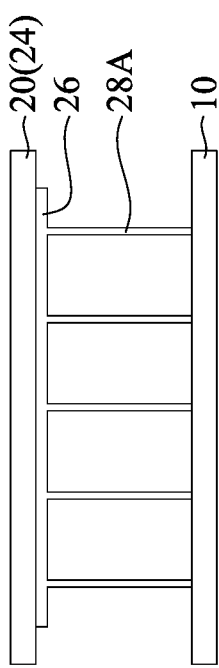

In some embodiments, the micro structures are a plurality of micro fibers 28A as shown in FIG. 5A. In some embodiments, the average diameter of each of the micro fibers 28A is in a range from about 0.5 μm to about 500 μm, and is in a range from about 2 μm to about 200 μm in other embodiments. In order to mount the pellicle 20 to the EUV photo mask 10, the micro fibers 28A are pressed against the surface of the EUV photo mask 10 such that the ends of the fibers are attached to the surface of the photo mask 10, as shown in FIG. 5B. In some embodiments, the pressing force (pressure) is in a range from about 0.01 N/cm$^2$ to about 1.0 N/cm$^2$. If the pressing force is smaller than this range the pellicle may not be fixed to the EUV photo mask, and if the pressing force is larger than this range, the fibers may be bent and may not be fixed to the EUV photo mask. In order to de-mount the pellicle 20 from the EUV photo mask 10, the pellicle is pressed against the EUV photo mask (or the photo mask 10 is pressed against the pellicle, or both) before the pellicle 20 is pulled from the EUV photo mask 10 or without pulling the pellicle. As shown in FIGS. 5C and 5D, by pressing the pellicle 20 against the photo mask 10 so as to decrease the distance between the pellicle 20 and the photo mask 10, the plurality of fibers are bent such that the ends of the fibers are detached from the surface of the photo mask 10. Once the ends of the fibers 28A are detached by bending, the pellicle 20 can be easily de-mounted from the photo mask 10 with minimum pull force. As set forth above, a pressing force is applied in the de-mounting operation before or without applying a pulling force to separate the pellicle 20 from the photo mask 10.

FIGS. 6A-6C and 6D-6F also show more details of pellicle mounting and dismounting operations, respectively, of FIGS. 5A-5D, in accordance with some embodiments of the present disclosure.

Figure 6C:
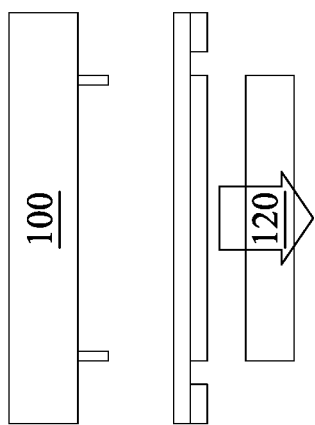
FIGS. 6A, 6B, 6C, 6D, 6E and 6F show pellicle mounting and dismounting operations in accordance with some embodiments of the present disclosure.
Figure 6F:
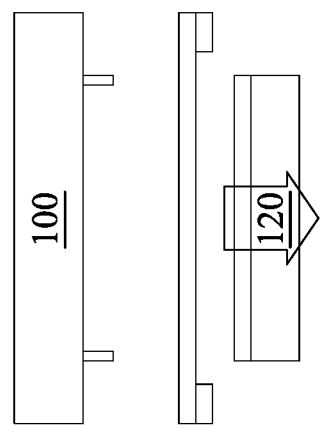
Figure 6B:
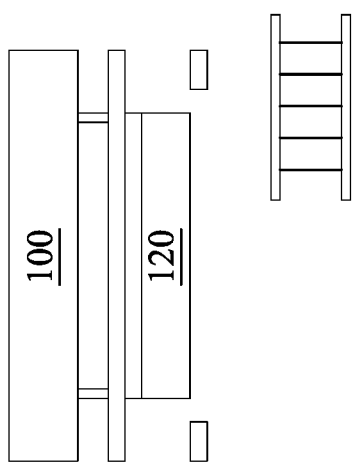
Figure 6E:
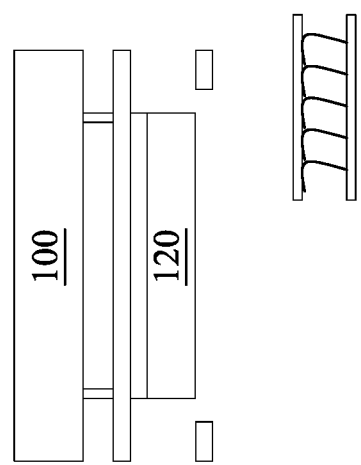
Figure 6A:
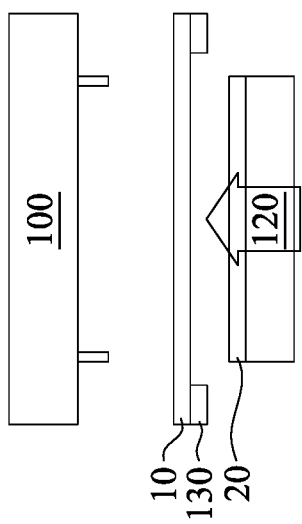

In a mounting operation, as shown in FIG. 6A, a pellicle 20 is supported by a pellicle holder 120, and an EUV photo mask 10 is supported by a mask holder 130 in a pellicle mounting apparatus. In some embodiments, the EUV photo mask 10 is placed on the mask holder 130 facing down and the pellicle is held by the pellicle holder 120 facing up. Then, as shown in FIG. 6B, the pellicle holder moves up toward the photo mask 10 and further toward a mask retainer 100 so that the photo mask 10 abuts the mask retainer. As shown in FIG. 5B, the ends of the micro fibers 28A are attached to the photo mask 10 during and as a result of the movement of the pellicle holder 120. Then, as shown in FIG. 6C, the pellicle holder 120 moves down so that the photo mask 10 with the pellicle 20 is placed on the mask holder 130.

Figure 6D:
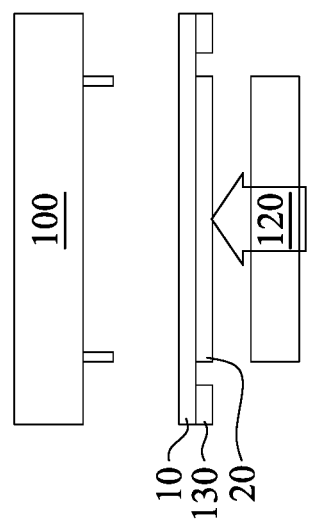

In a de-mounting operation, the photo mask 10 with the pellicle 20 is placed on the mask holder 130, as shown in FIG. 6D. Then, as shown in FIG. 6E, the pellicle holder 120 moves up toward the photo mask 10 with the pellicle 20, and further toward the mask retainer 100 so that the photo mask 10 abuts the mask retainer. As shown in FIG. 5C, the pellicle holder 120 presses the pellicle 20 so that the plurality of fibers are bent. Then, as shown in FIG. 6F, the pellicle holder 120 moves down so that the photo mask 10 without the pellicle 20 is placed on the mask holder 130.

Figure 6G:
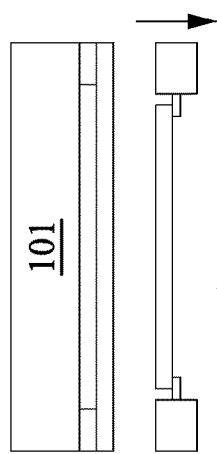
FIGS. 6G, 6H, 6I, 6J and 6K show pellicle mounting and dismounting operations in accordance with some embodiments of the present disclosure.
Figure 6I:
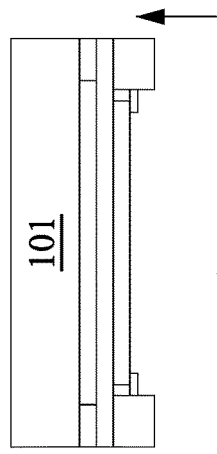
Figure 6K:
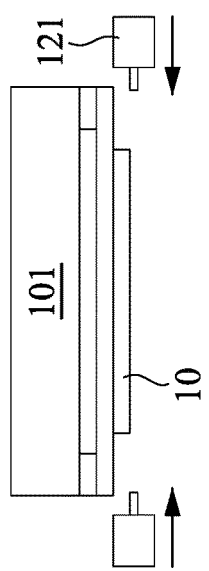
Figure 6H:
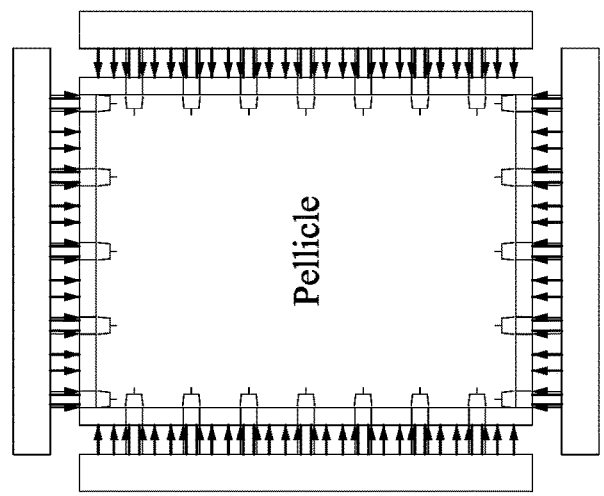
Figure 6J:
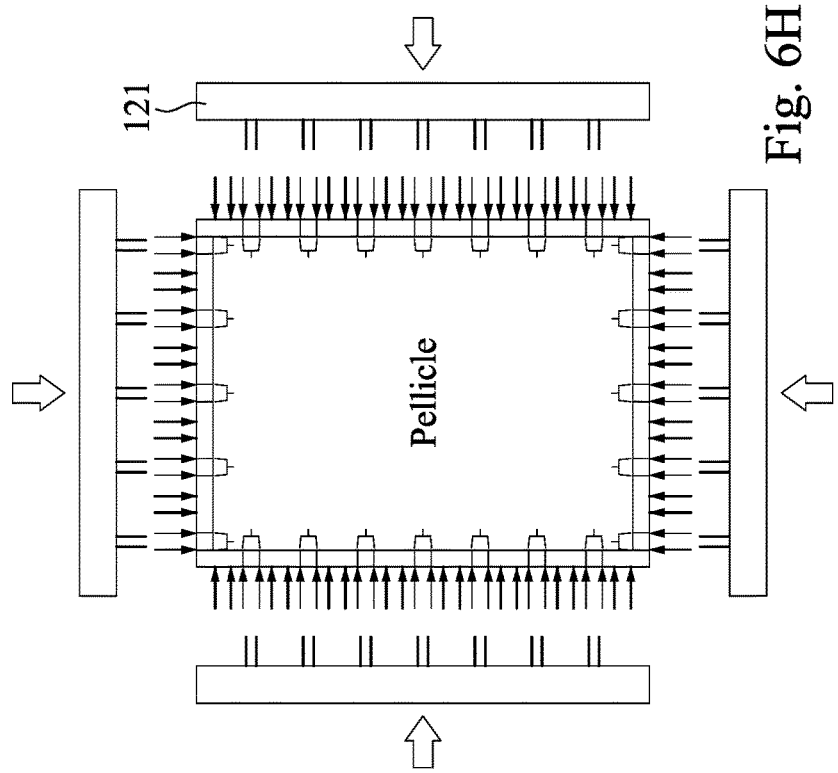

In other embodiments, pellicle holder 121 supports the side faces of the pellicle as shown in FIGS. 6G-6K. FIGS. 6G-6K show a de-mounting operation. FIGS. 6H and 6J are plan views. In some embodiments, the mask holder 101 holds the photo mask 10 with a pellicle 20 as shown in FIG. 6G. Forks of the pellicle holder 121 are attached to the side faces of the pellicle 20. Then, the pellicle holder 121 moves the pellicle 20 against the photo mask 10 to release the micro fibers from the surface of the photo mask 10 as shown in FIGS. 6I and 6J. Then, the pellicle holder 121 moves down to de-mount the pellicle 20 as shown in FIG. 6K. In some embodiments, instead of or in addition to the vertical movement of the pellicle holder, the photo mask holder vertically moves (i.e., relative movement to each other).

FIGS. 7A, 7B, 7C and 7D show pellicle mounting and dismounting operations in accordance with some embodiments of the present disclosure.

Figure 7C:
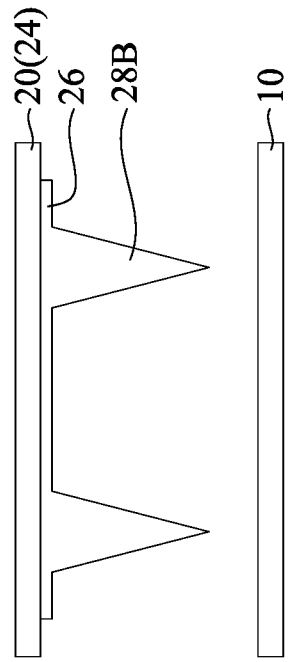
FIGS. 7A, 7B, 7C and 7D show pellicle mounting and dismounting operations in accordance with some embodiments of the present disclosure.
Figure 7D:
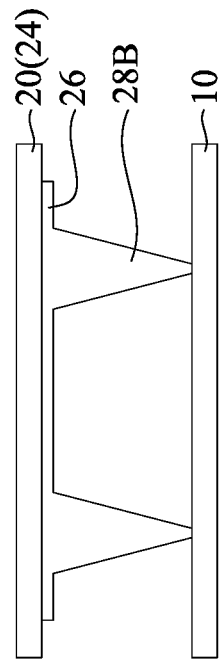
Figure 7A:
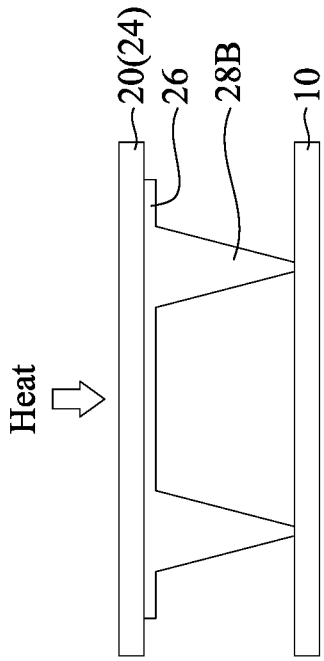

In some embodiments, the micro structures are a plurality of micro cones 28B having a bottom disposed on the base layer 26 and a top, as shown in FIG. 7A. In some embodiments, the top of the cones has a width or diameter W1 in a range from about 0.5 μm to about 500 μm, or in a range from about 2 μm to about 200 μm in other embodiments. In some embodiments, the cone has a circular or an elliptical bottom in plan view and in other embodiments, the cone has a rectangular or a square bottom in plan view. In some embodiments, a ratio between the top width W1 and the bottom width W2 (W2/W1) is in a range from about 1 (i.e., column shape) to about 100 and is in a range from about 5 to about 20 in other embodiments.

Figure 7B:
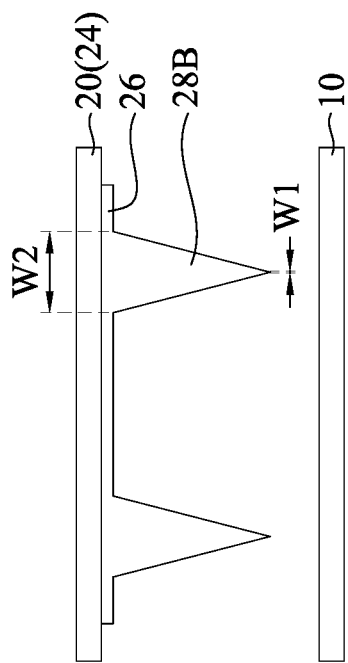

In some embodiments, the micro cones 28B are made of shape memory elastomer, which returns the original shape by applying heat to the deformed shapes. In order to mount the pellicle 20 to the EUV photo mask 10, the micro cones 28B are pressed against the surface of the EUV photo mask 10 such that the tops of the cones are deformed to have a sufficient contact area and are attached to the surface of the photo mask 10, as shown in FIG. 7B. Then, heat is applied to the micro cones at a temperature higher than the threshold temperature Tg. In some embodiments, Tg is in a range from about 50° C. to 110° C. depending the material. In order to de-mount the pellicle 20 from the EUV photo mask 10, the cones are heated at the temperature higher than the threshold temperature Tg before the pellicle 20 is pulled from the EUV photo mask 10 or without pulling the pellicle. As shown in FIGS. 7C and 7D, by heating the cones, the plurality of cones return to their original shape to decrease the contact area, and thus the ends (tops) of the cones are detached from the surface of the photo mask 10. Once the ends of the cones 28B are detached by heating, the pellicle 20 can be easily de-mounted from the photo mask 10 with a minimum pull force. As set forth above, heat is applied in the de-mounting operation before or without applying the pulling force to separate the pellicle 20 from the photo mask 10. In some embodiments, the heat is applied from a heater disposed in the pellicle holder or the mask retainer, and in other embodiments, an energy beam, for example an infrared light beam, is applied to the pellicle or the photo mask, or directly to the micro cones. In other embodiments, the atmosphere around the photo mask is heated or heated gas is applied to the photo mask and the pellicle.

FIGS. 8A-8D and 8E-8G also show more details of the pellicle mounting and dismounting operations, respectively, of FIGS. 7A-7D, in accordance with some embodiments of the present disclosure.

Figure 8A:
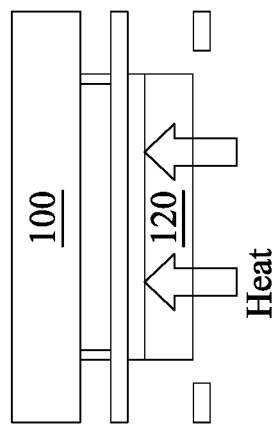
FIGS. 8A, 8B, 8C, 8D, 8E, 8F and 8G show pellicle mounting and dismounting operations in accordance with some embodiments of the present disclosure.
Figure 8B:
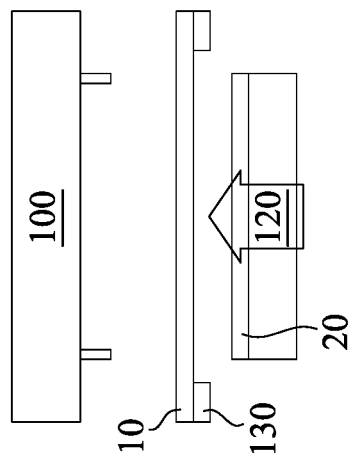
Figure 8C:
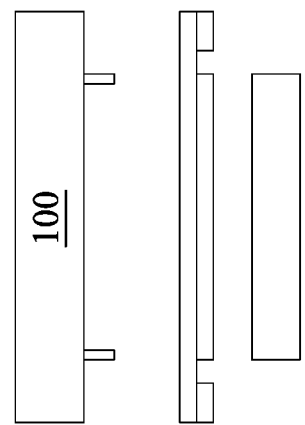
Figure 8D:
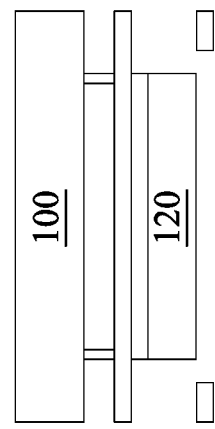

In a mounting operation, as shown in FIG. 8A, a pellicle 20 is supported by a pellicle holder 120, and a EUV photo mask 10 is supported by a mask holder 130 in a pellicle mounting apparatus. In some embodiments, the EUV photo mask 10 is placed on the mask holder 130 facing down and the pellicle is held by the pellicle holder 120 facing up. Then, as shown in FIG. 8B, the pellicle holder moves up toward the photo mask 10 and further toward a mask retainer 100 so that the photo mask 10 abuts the mask retainer. As shown in FIG. 7B, the ends of the micro cones 28B are attached to the photo mask 10 during and as a result of the movement of the pellicle holder 120. Then, as shown in FIG. 8B, heat is applied from the pellicle holder 120 to the micro cones 28 at the temperature higher than the threshold temperature Tg, in some embodiments. In other embodiments, the heat is applied from the photo mask holder 100. Then, while the cones are deformed and attached to the photo mask, the temperature of the cones is decreased (cooled down) below the threshold temperature Tg (e.g., 25° C.) as shown in FIG. 8C. Then, the pellicle holder 120 moves down so that the photo mask 10 with the pellicle 20 is placed on the mask holder 130 as shown in FIG. 8D.

Figure 8E:
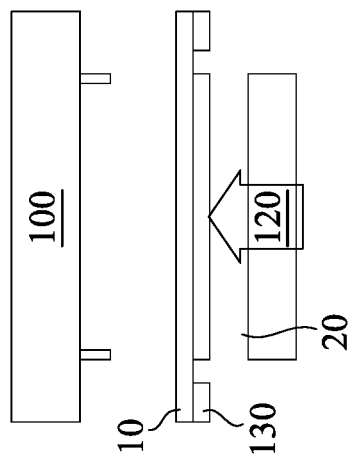
Figure 8F:
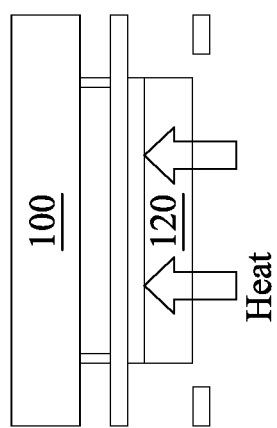
Figure 8G:
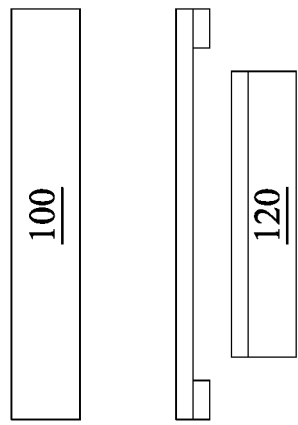

In a de-mounting operation, the photo mask 10 with the pellicle 20 is placed on the mask holder 130, as shown in FIG. 8E. Then, as shown in FIG. 8F, heat is applied from the pellicle holder 120 to the micro cones 28 at the temperature higher than the threshold temperature Tg, in some embodiments. In other embodiments, the heat is applied from the photo mask holder 100. As shown in FIG. 7C, the heat returns the shape of the cones to the original shape, thereby detaching the cones from the surface of the photo mask 10. Then, as shown in FIG. 8G, the pellicle holder 120 moves down so that the photo mask 10 without the pellicle 20 is placed on the mask holder 130.

FIGS. 9A, 9B, 9C and 9D show pellicle mounting and dismounting operations in accordance with some embodiments of the present disclosure.

Figure 9A:
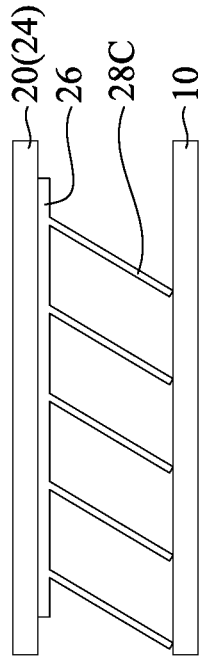
FIGS. 9A, 9B, 9C and 9D show pellicle mounting and dismounting operations in accordance with some embodiments of the present disclosure.
Figure 9B:
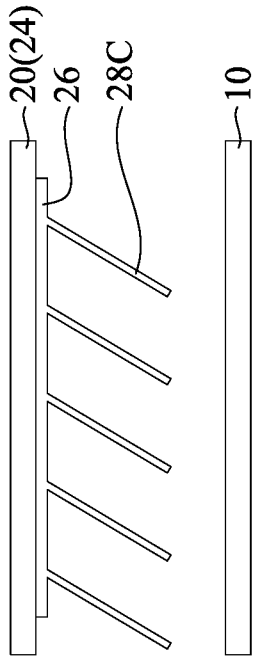
Figure 9C:
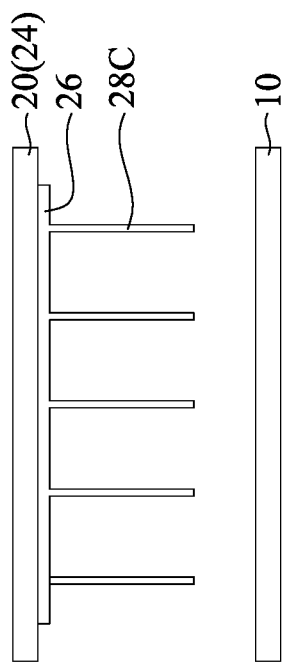
Figure 9D:
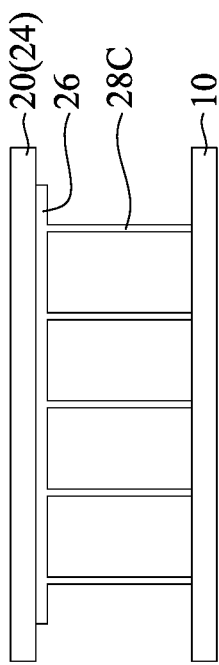

In some embodiments, the micro structures are a plurality of micro fibers 28C made of magnetic elastomer (magnetorheological elastomer (MRE)), as shown in FIG. 9A. The magnetic elastomer includes polymeric matrix (base polymer) with embedded micro- or nano-sized ferromagnetic particles. In some embodiments, as shown in FIG. 9A, the micro structures have fiber shape and the average diameter of each of the micro fibers 28C is in a range from about 0.5 μm to about 500 μm, and is in a range from about 2 μm to about 200 μm in other embodiments. In order to mount the pellicle 20 to the EUV photo mask 10, the micro fibers 28C are pressed against the surface of the EUV photo mask 10 such that the ends of the fibers are attached to the surface of the photo mask 10, as shown in FIG. 9B. In some embodiments, the pressing force (pressure) is in a range from about 0.01 N/cm$^2$ to about 1.0 N/cm$^2$. If the pressing force is smaller than this range the pellicle may not be fixed to the EUV photo mask, and if the pressing force is larger than this range, the fibers may be bent and may not be fixed to the EUV photo mask. In order to de-mount the pellicle 20 from the EUV photo mask 10, a magnetic field is applied to the micro fibers 28C to bend them as shown in FIG. 9C. As shown in FIGS. 9C and 9D, the micro fibers 28C are bent such that the ends of the fibers are detached from the surface of the photo mask 10. Once the ends of the fibers 28C are detached by bending, the pellicle 20 can be easily de-mounted from the photo mask 10 with minimum pull force. As set forth above, a magnetic force is applied in the de-mounting operation before or without applying a pulling force to separate the pellicle 20 from the photo mask 10.

FIGS. 10A-10C and 10D-10F also show more details of pellicle mounting and dismounting operations, respectively, of FIGS. 9A-9D, in accordance with some embodiments of the present disclosure.

Figure 10A:
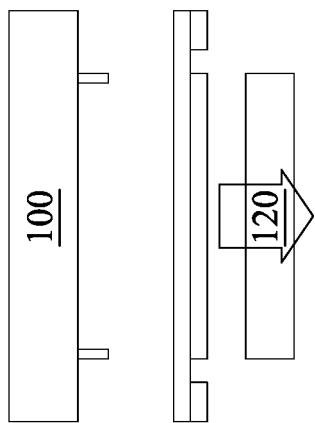
FIGS. 10A, 10B, 10C, 10D, 10E and 10F show pellicle mounting and dismounting operations in accordance with some embodiments of the present disclosure.
Figure 10B:
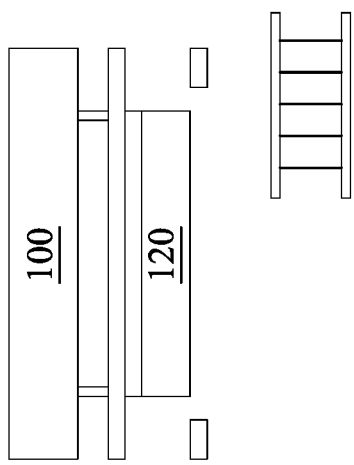
Figure 10C:
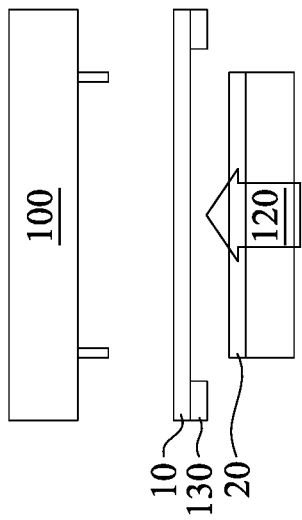

In a mounting operation, as shown in FIG. 10A, a pellicle 20 is supported by a pellicle holder 120, and an EUV photo mask 10 is supported by a mask holder 130 in a pellicle mounting apparatus. In some embodiments, the EUV photo mask 10 is placed on the mask holder 130 facing down and the pellicle is held by the pellicle holder 120 facing up. Then, as shown in FIG. 10B, the pellicle holder moves up toward the photo mask 10 and further toward a mask retainer 100 so that the photo mask 10 abuts the mask retainer. As shown in FIG. 9B, the ends of the micro fibers 28C are attached to the photo mask 10 during and as a result of the movement of the pellicle holder 120. Then, as shown in FIG. 10C, the pellicle holder 120 moves down so that the photo mask 10 with the pellicle 20 is placed on the mask holder 130.

Figure 10D:
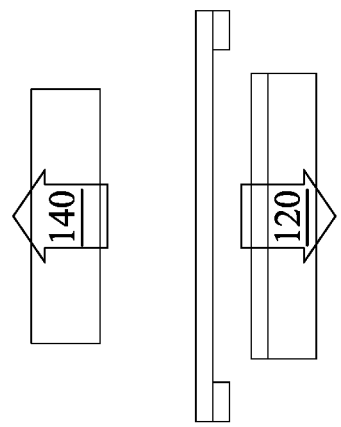
Figure 10E:
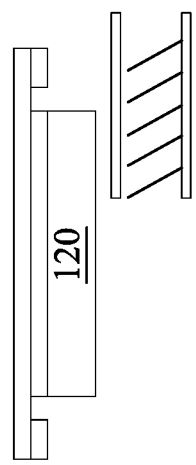
Figure 10F:
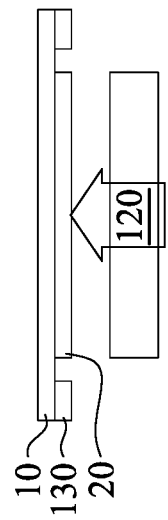

In a de-mounting operation, the photo mask 10 with the pellicle 20 is placed on the mask holder 130, as shown in FIG. 10D. Then, as shown in FIG. 10E, the pellicle holder 120 moves up toward the photo mask 10 with the pellicle 20, and a magnet 140 (permanent or electro magnet) is placed over the photo mask 10. As shown in FIG. 9C, by the magnetic force from the magnet 140, the plurality of fibers 28C are bent and detached from the photo mask 10. Then, as shown in FIG. 10F, the pellicle holder 120 moves down so that the photo mask 10 without the pellicle 20 is placed on the mask holder 130.

FIGS. 11A, 11B, 11C and 11D show pellicle mounting and dismounting operations in accordance with some embodiments of the present disclosure.

Figure 11A:
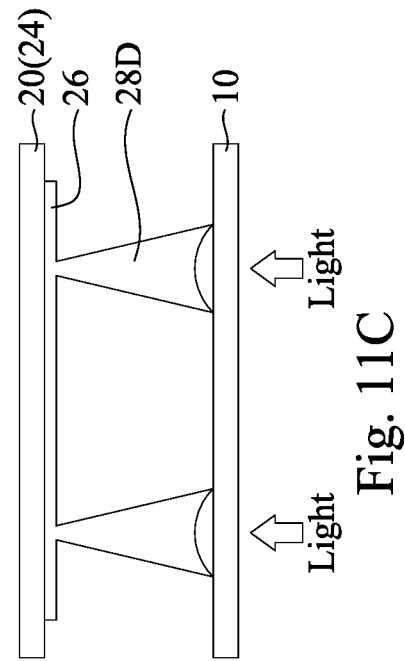
FIGS. 11A, 11B, 11C and 11D show pellicle mounting and dismounting operations in accordance with some embodiments of the present disclosure.

In some embodiments, the micro structures are a plurality of micro cones 28D having a top disposed on the base layer 26 and a bottom, as shown in FIG. 11A. In some embodiments, the top of the cones has a width or diameter W3 in a range from about 0.5 µm to about 500 µm, or in a range from about 2 µm to about 200 µm in other embodiments. In some embodiments, the cone has a circular or an elliptical bottom in plan view and in other embodiments, the cone has a rectangular or a square bottom in plan view. In some embodiments, a ratio between the top width W3 and the bottom width W4 (W4/W3) is in a range from about 1 (i.e., column shape) to about 100 and is in a range from about 5 to about 20 in other embodiments.

In some embodiments, the micro cones 28D are made of a light responsive elastomer, which changes its shape by the application of light. In some embodiments, the light responsive elastomer is a liquid crystalline elastomer.

Figure 11C:
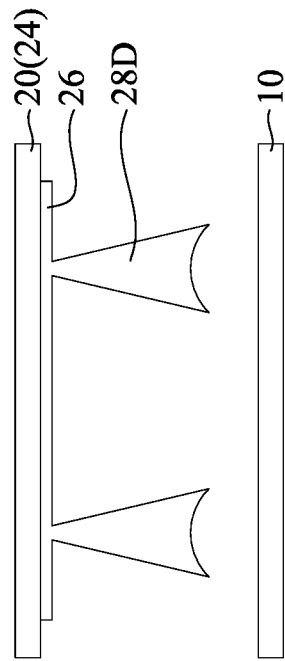
Figure 11B:
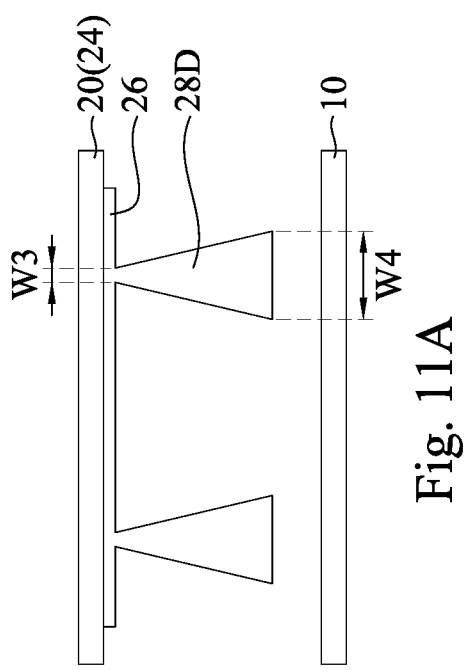
Figure 11D:
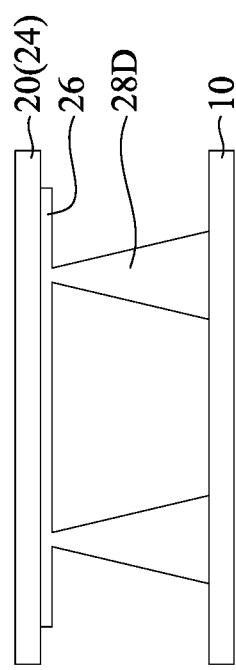

In order to mount the pellicle 20 to the EUV photo mask 10, the bottoms of the micro cones 28D are pressed against the surface of the EUV photo mask 10 such that the bottoms of the cones 28D are attached to the surface of the photo mask 10, as shown in FIG. 11B. In order to de-mount the pellicle 20 from the EUV photo mask 10, light having target wavelength (e.g., ultra violet light, visible light or infrared light) is applied to the cones 28D before the pellicle 20 is pulled from the EUV photo mask 10 or without pulling the pellicle. As shown in FIGS. 11C and 11D, by irradiating the cones with the light, the plurality of cones 28D deform to decrease the contact area, and thus the ends (bottoms) of the cones are detached from the surface of the photo mask 10. Once the ends of the cones 28D are detached, the pellicle 20 can be easily de-mounted from the photo mask 10 with minimal pull force. As set forth above, light is applied in the de-mounting operation before or without applying the pulling force to separate the pellicle 20 from the photo mask 10.

FIGS. 12A-12D and 12E-12G also show more details of pellicle mounting and dismounting operations, respectively, of FIGS. 11A-11D, in accordance with some embodiments of the present disclosure.

Figure 12C:
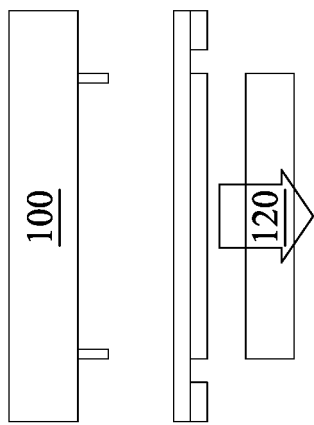
FIGS. 12A, 12B, 12C, 12D, 12E and 12F show pellicle mounting and dismounting operations in accordance with some embodiments of the present disclosure.
Figure 12B:
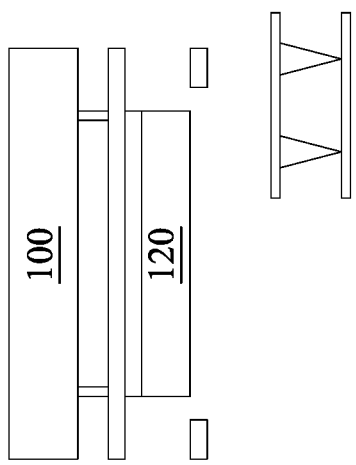
Figure 12A:
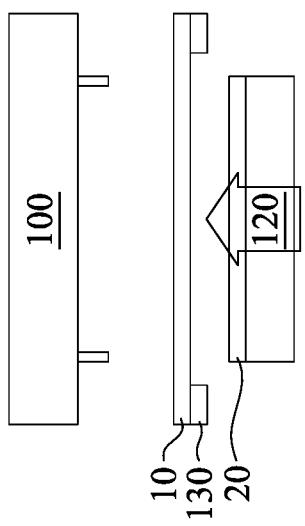

In a mounting operation, as shown in FIG. 12A, a pellicle 20 is supported by a pellicle holder 120, and a EUV photo mask 10 is supported by a mask holder 130 in a pellicle mounting apparatus. In some embodiments, the EUV photo mask 10 is placed on the mask holder 130 facing down and the pellicle is held by the pellicle holder 120h facing up. Then, as shown in FIG. 12B, the pellicle holder moves up toward the photo mask 10 and further toward a mask retainer 100 so that the photo mask 10 abuts the mask retainer. As shown in FIG. 11B, the ends of the micro cones 28D are attached to the photo mask 10 during and as a result of the movement of the pellicle holder 120. Then, the pellicle holder 120 moves down so that the photo mask 10 with the pellicle 20 is placed on the mask holder 130 as shown in FIG. 12C.

Figure 12F:
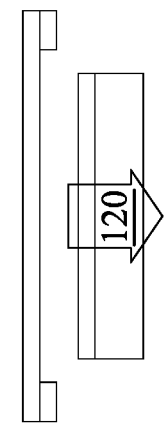
Figure 12E:
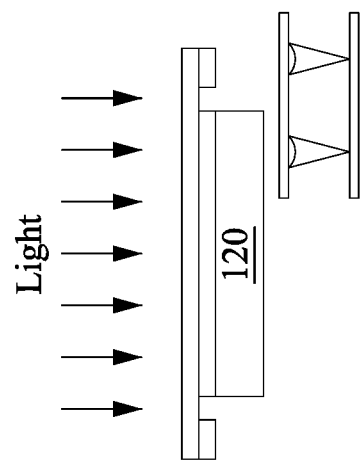
Figure 12D:
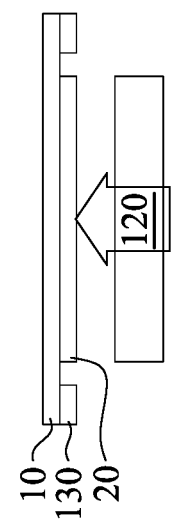

In a de-mounting operation, the photo mask 10 with the pellicle 20 is placed on the mask holder 130, as shown in FIG. 12D. Then, as shown in FIG. 12E, light is applied to the micro cones 28 above the photo mask or below the photo mask 10. As shown in FIG. 11C, the light exposure changes the shape of the cones, thereby detaching the cones from the surface of the photo mask 10. Then, as shown in FIG. 12F, the pellicle holder 120 moves down so that the photo mask 10 without the pellicle 20 is placed on the mask holder 130.

FIGS. 13A, 13B, 13C and 13D show pellicle mounting and dismounting operations in accordance with some embodiments of the present disclosure.

Figure 13A:
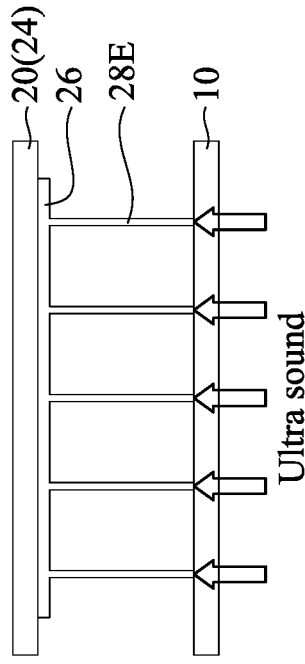
FIGS. 13A, 13B, 13C and 13D show pellicle mounting and dismounting operations in accordance with some embodiments of the present disclosure.
Figure 13B:
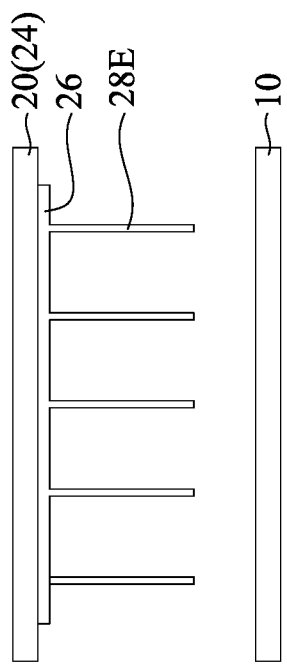
Figure 13C:
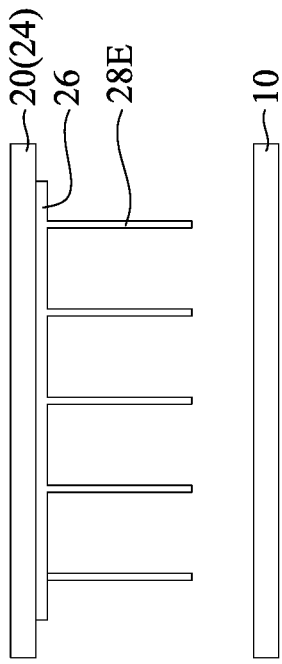
Figure 13D:
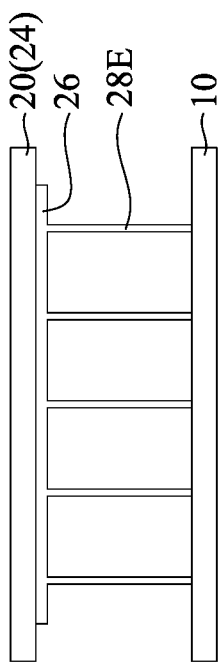

In some embodiments, the micro structures are a plurality of micro fibers 28E or micro cones as shown in FIG. 13A. In some embodiments, as shown in FIG. 13A, the micro structures have a fiber shape and the average diameter of each of the micro fibers 28C is in a range from about 0.5 µm to about 500 µm, and is in a range from about 2 µm to about 200 µm in other embodiments. In order to mount the pellicle 20 to the EUV photo mask 10, the micro fibers 28C are pressed against the surface of the EUV photo mask 10 such that the ends of the fibers are attached to the surface of the photo mask 10, as shown in FIG. 13B. In some embodiments, the pressing force (pressure) is in a range from about 0.01 N/cm$^2$ to about 1.0 N/cm$^2$. If the pressing force is smaller than this range the pellicle may not be fixed to the EUV photo mask, and if the pressing force is larger than this range, the fibers may be bent and may not be fixed to the EUV photo mask. In order to de-mount the pellicle 20 from the EUV photo mask 10, ultrasound is applied to the micro fibers 28C as shown in FIG. 13C. As shown in FIGS. 13C and 13D, the micro fibers 28E are detached from the surface of the photo mask 10 by the vibration caused by the ultrasound. Once the ends of the fibers 28E are detached by bending, the pellicle 20 can be easily de-mounted from the photo mask 10 with minimal pull force. As set forth above, ultrasound is applied in the de-mounting operation before or without applying the pulling force to separate the pellicle 20 from the photo mask 10. In some embodiments, radio waves (e.g., microwaves) are applied to detach the micro structures from the photo mask 10.

FIGS. 14A-14C and 14D-14F also show more details of pellicle mounting and dismounting operations, respectively, of FIGS. 13A-13D, in accordance with some embodiments of the present disclosure.

In a mounting operation, as shown in FIG. 14A, a pellicle 20 is supported by a pellicle holder 120, and an EUV photo mask 10 is supported by a mask holder 130 in a pellicle mounting apparatus. In some embodiments, the EUV photo mask 10 is placed on the mask holder 130 facing down and the pellicle is held by the pellicle holder 120 facing up. Then, as shown in FIG. 14B, the pellicle holder moves up toward the photo mask 10 and further toward a mask retainer 100 so that the photo mask 10 abuts the mask retainer. As shown in FIG. 13B, the ends of the micro fibers 28C are attached to the photo mask 10 during and as a result of the movement of the pellicle holder 120. Then, as shown in FIG. 14C, the pellicle holder 120 moves down so that the photo mask 10 with the pellicle 20 is placed on the mask holder 130.

In a de-mounting operation, the photo mask 10 with the pellicle 20 is placed on the mask holder 130, as shown in FIG. 14D. Then, as shown in FIG. 14E, the pellicle holder 120 moves up toward the photo mask 10 with the pellicle 20, and ultrasound is applied to the micro fibers. As shown in FIG. 13C, by vibrations caused by the ultrasound, the plurality of fibers 28E are detached from the photo mask 10. Then, as shown in FIG. 14F, the pellicle holder 120 moves down so that the photo mask 10 without the pellicle 20 is placed on the mask holder 130.

Figure 15:
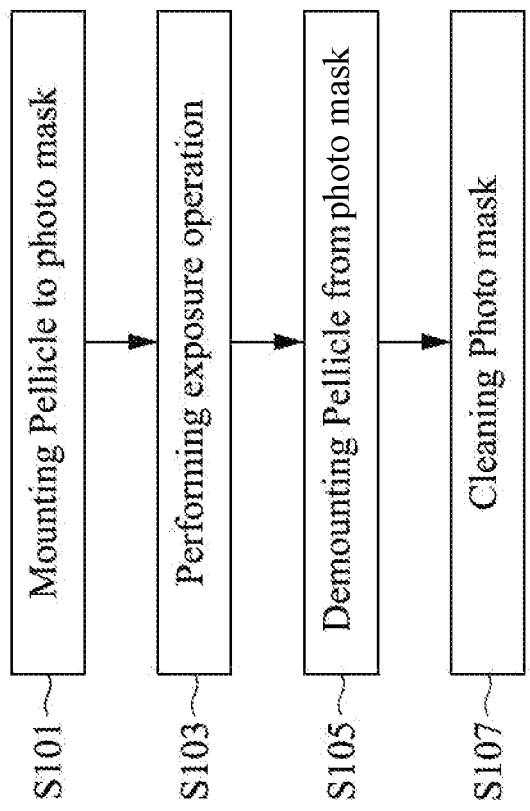
FIG. 15 is a flowchart of pellicle mounting and dismounting operations in accordance with some embodiments of the present disclosure.

FIG. 15 is a flowchart of pellicle mounting and dismounting operations in accordance with some embodiments of the present disclosure. At S101, a pellicle is mounted on an EUV photo mask. In S103, the EUV photo mask with the pellicle is used with an EUV lithography apparatus (e.g., scanner) to fabricate patterns over a semiconductor wafer. Then, at S105, the pellicle is de-mounted from the photo mask. At S107, the photo mask and the pellicle are subjected to cleaning and/or inspection operations. Then, in some embodiments, the photo mask is stored in a mask stocker and/or a new pellicle is attached to the photo mask.

FIG. 16A shows a flowchart of a method making a semiconductor device, and FIGS. 16B, 16C, 16D and 16E show a sequential manufacturing operation of a method of making a semiconductor device in accordance with embodiments of present disclosure.

FIG. 16A shows a flowchart of a method of making a semiconductor device, and FIGS. 16B, 16C, 16D and 16E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S201 of FIG. 16A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S202 of FIG. 16A, a photo resist layer is formed over the target layer, as shown in FIG. 16B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable techniques. The coated photo resist layer may be further baked to drive out solvent in the photo resist layer. At S203 of FIG. 16A, the photoresist layer is patterned using an EUV reflective mask with a pellicle as set forth above, as shown in FIG. 16B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

At S204 of FIG. 16A, the target layer is patterned utilizing the patterned photoresist layer as an etching mask, as shown in FIG. 16D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 16E.

As set forth above, the frame of the pellicle includes a plurality of micro structures. When the micro structures are attached to the photo mask, the total contact area between the micro structures and the surface of the photo mask is about 20% to about 60% of the total area of the bottom surface of the frame. Thus, there are plurality of air paths formed between the pellicle frame and the photo mask, which suppress rupture of the pellicle or the photo mask when used in s pressure changing apparatus. Further, in the foregoing embodiments, in de-mounting the pellicle from the photo mask, forces other than a pulling forces are applied to de-mount the pellicle from the photo mask, no or a minimal pulling force to remove the pellicle from the photo mask is required, which also suppress rupture of the pellicle or the photo mask. In addition, substantially no residue of adhesive material remains on the photo mask after the pellicle is removed, and thus no additional cleaning process after demounting the pellicle may be necessary. Further, the demounted pellicle may be reused. In addition, photo masks need are subjected to defect inspections periodically, and the mask inspection can be performed by using a non-EUV light source inspector, when a pellicle is demounted before the inspection without leaving glue residues and particles, and then the pellicle is mounted back after the inspection. This inspection process does not require an expensive EUV light source inspector to inspect mask with EUV pellicle.

According to some embodiments of the present disclosure, in a method of de-mounting a pellicle from a photo mask, the photo mask with the pellicle is placed on a pellicle holder. The pellicle is attached to the photo mask by a plurality of micro structures. The plurality of micro structures are detached from the photo mask by applying a force or energy to the plurality of micro structures before or without applying a pulling force to separate the pellicle from the photo mask. The pellicle is de-mounted from the photo mask. In one or more of the foregoing and following embodiments, the plurality of micro structures are made of an elastomer. In one or more of the foregoing and following embodiments, the plurality of micro structures are a plurality of micro fibers. In one or more of the foregoing and following embodiments, the applying the force or energy comprises applying a pushing force to decrease a distance between the photo mask and the pellicle. In one or more of the foregoing and following embodiments, the micro fibers are made of magnetic elastomer, and the applying the force or energy comprises applying magnetic field. In one or more of the foregoing and following embodiments, the applying the force or energy comprises applying ultrasound. In one or more of the foregoing and following embodiments, the plurality of micro structures are made of a shape memory elastomer, the plurality of micro structures are a plurality of micro cones each having a top and a bottom disposed on an surface of the pellicle, and the applying the force or energy comprises applying heat. In one or more of the foregoing and following embodiments, the plurality of micro structures are made of a light responsive elastomer, the plurality of micro structures are a plurality of micro cones each having a top disposed on an surface of the pellicle and a bottom, and the applying the force or energy comprises applying light.

In accordance with another aspect of the present disclosure, in a method of mounting a pellicle from a photo mask, the photo mask is placed on a photo mask holder, the pellicle is placed on a pellicle holder. The pellicle includes a frame having an opening, and a plurality of micro structures are disposed on a bottom of the frame. The plurality of micro structures are attached to the photo mask by moving the pellicle holder so that the plurality of micro structures abut a surface of the photo mask. The pellicle holder is moved to leave the photo mask with the pellicle on the mask holder. In one or more of the foregoing and following embodiments, the plurality of micro structures are a plurality of micro fibers made of an elastomer, and in the attaching the plurality of micro structures, ends of the plurality of micro fibers are attached to the surface of the photo mask. In one or more of the foregoing and following embodiments, the elastomer is a magnetic elastomer. In one or more of the foregoing and following embodiments, the plurality of micro structures are a plurality of micro cone made of a shape memory elastomer, and in the attaching the plurality of micro structures, tops of the plurality of micro cones are attached to the surface of the photo mask, and heat is applied to the attached plurality of micro cones. In one or more of the foregoing and following embodiments, the plurality of micro structures are a plurality of micro cone made of an elastomer, and in the attaching the plurality of micro structures, bottoms of the plurality of micro fibers are attached to the surface of the photo mask. In one or more of the foregoing and following embodiments, the heat is applied from a heater disposed in the pellicle holder. In one or more of the foregoing and following embodiments, the attaching the plurality of micro structures comprises detaching the photo mask from the mask holder and pressing the photo against a mask retainer.

In accordance with another aspect of the present disclosure, a pellicle for an extreme ultra violet (EUV) photo mask includes an EUV transparent membrane, a frame having an opening, and a plurality of micro structures made of an adhesive elastomer and disposed on a bottom of the frame. In one or more of the foregoing and following embodiments, the plurality of micro structures are a plurality of fibers having an average diameter in a range from 0.5 μm to 500 μm. In one or more of the foregoing and following embodiments, the plurality of micro structures are made of a shape memory elastomer. In one or more of the foregoing and following embodiments, the plurality of micro structures are made of a magnetic elastomer. In one or more of the foregoing and following embodiments, the plurality of micro structures are made of a light responsive elastomer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle for an extreme ultra violet (EUV) photo mask, the pellicle comprising:
   an EUV transparent membrane;
   a frame having an opening;
   a plurality of micro structures made of an adhesive elastomer and disposed on a bottom of the frame; and
   a base layer disposed between the plurality of micro structures and the bottom of the frame,
   wherein the base layer is made of a different material than the plurality of micro structures.

2. The pellicle of claim 1, wherein the plurality of micro structures are a plurality of fibers having an average diameter in a range from 0.5 μm to 500 μm.

3. The pellicle of claim 2, wherein the plurality of micro structures are made of one selected from the group consisting of polydimethylsiloxane (PDMS), polyurethane (PU), polymethyl methacrylate (PMMA), polypropylene (PP), polyurethane acrylate (PUA) and fluorocarbon.

4. The pellicle of claim 2, wherein a length of the plurality of micro structures is 10% to 40% longer than a length in a range from 1 μm to 20,000 μm.

5. The pellicle of claim 2, wherein a number of the plurality of micro structures per unit area is in a range from 1 pieces/mm² to 10,000 pieces/mm².

6. The pellicle of claim 2, wherein a space between adjacent micro structures is in a range from 1 μm to 10,000 μm.

7. The pellicle of claim 1, further comprising:
   an adhesive layer disposed between the bottom of the frame and the base layer, wherein the adhesive layer is made of a different material than the plurality of micro structures and the base layer.

8. A pellicle for an extreme ultra violet (EUV) photo mask, the pellicle comprising:
   an EUV transparent membrane;
   a frame having an opening; and
   a plurality of micro cones made of an adhesive elastomer and disposed on a bottom of the frame,
   wherein each of the plurality of micro cones has a circular or elliptical shape in plan view.

9. The pellicle of claim 8, wherein each of the plurality of micro cones has a bottom part disposed on the bottom of the frame and a top part having a smaller area than the bottom part.

10. The pellicle of claim 9, wherein the top part has a width or a diameter in a range from 0.5 μm to 500 μm.

11. The pellicle of claim 10, wherein a ratio of the width or diameter of the top part to the width or diameter of the bottom part is in a range from 5 to 20.

12. The pellicle of claim 9, wherein the plurality of micro cones are made of a shape memory elastomer.

13. The pellicle of claim 8, wherein each of the plurality of micro cones has a bottom part disposed on the bottom of the frame and a top part having a larger area than the bottom part.

14. The pellicle of claim 13, wherein a ratio of a width or diameter of the bottom part to a width or diameter of the top part is in a range from 5 to 20.

15. The pellicle of claim 13, wherein the plurality of micro cones are made of a light responsive elastomer.

16. The pellicle of claim 8, further comprising:
   a base layer disposed between the plurality of micro cones and the bottom of the frame,
   wherein the base layer is made of a different material than the plurality of micro cones.

17. The pellicle of claim 16, further comprising:
   an adhesive layer disposed between the bottom of the frame and the base layer, wherein the adhesive layer is made of a different material than the plurality of micro cones and the base layer.

18. A pellicle for an extreme ultra violet (EUV) photo mask, the pellicle comprising:
   an EUV transparent membrane;
   a frame having an opening;
   a plurality of micro structures made of a magnetic elastomer and disposed on a bottom of the frame; and a base layer disposed between the plurality of micro structures and the bottom of the frame,
wherein the base layer is made of a different material than the plurality of micro structures.

19. The pellicle of claim 18, wherein the plurality of micro structures include micro- or nano-sized ferromagnetic particles.

20. The pellicle of claim 18, further comprising:
an adhesive layer disposed between the bottom of the frame and the base layer, wherein the adhesive layer is made of a different material than the plurality of micro structures and the base layer.

* * * * *